(12) United States Patent
Suzuki et al.

(10) Patent No.: US 7,187,050 B2
(45) Date of Patent: Mar. 6, 2007

(54) OPTICAL SENSOR AND METHOD OF MANUFACTURING THE SAME

(75) Inventors: Akiko Suzuki, Akishima (JP); Akinobu Sato, Soka (JP)

(73) Assignee: Japan Aviation Electronics Industry Limited, Tokyo (JP)

( * ) Notice: Subject to any disclaimer, the term of this patent is extended or adjusted under 35 U.S.C. 154(b) by 0 days.

(21) Appl. No.: 10/959,641

(22) Filed: Oct. 5, 2004

(65) Prior Publication Data

US 2005/0145964 A1   Jul. 7, 2005

(30) Foreign Application Priority Data

Oct. 6, 2003   (JP) .............................. 2003-346890

(51) Int. Cl.
  *H01L 29/72* (2006.01)
(52) U.S. Cl. ........................ 257/432; 257/457; 257/464
(58) Field of Classification Search ................ 257/431, 257/432, 457, 464
  See application file for complete search history.

(56) References Cited

U.S. PATENT DOCUMENTS 4,895,164 A   1/1990   Wood

2003/0095755 A1 *  5/2003  Vaganov et al. ............... 385/88
2005/0190456 A1 *  9/2005  Nishioka et al. ............. 359/676

FOREIGN PATENT DOCUMENTS

| JP | 5-28617 | 4/1993 |
|---|---|---|
| JP | 08-191800 | 7/1996 |
| JP | 2001-281053 | 10/2001 |
| JP | 2001-349785 | 12/2001 |
| JP | 2002-048637 | 2/2002 |
| JP | 2002-048646 | 2/2002 |
| JP | 2002-048649 | 2/2002 |

* cited by examiner

*Primary Examiner*—Edward Wojciechowicz
(74) *Attorney, Agent, or Firm*—David N. Lathrop, Esq.; Gallagher & Lathrop

(57) ABSTRACT

A cubic element of photonic crystal is integrally formed on the surface of a photo-detection element, and a portion of the photonic crystal cubic element is irradiated with ultraviolet rays thereby to change the refractive index of the portion of the cubic element that has been irradiated with ultraviolet rays. Alternatively, by causing globular particles having different refractive indices to eject on the surface of the photo-detection element from an ink-jet apparatus having a nozzle provided with a temperature control part by controlling temperature of the nozzle to form a laminate of globular particle layers having different refractive indices, a photonic crystal lens is integrally formed on the surface of the photo-detection element.

10 Claims, 9 Drawing Sheets

OPTICAL SENSOR AND METHOD OF MANUFACTURING THE SAME

BACKGROUND OF THE INVENTION

1. Field of the Invention

The present invention relates to an optical sensor that detects (is sensitive to) light or rays and a method of manufacturing the optical sensor, and more particularly, to an optical sensor that comprises a photo-detection element or device and a light condensation or collection element for conducting light or rays to the photo-detection element, and a method of manufacturing the optical sensor.

2. Description of the Related Art

Various types of optical sensors each detecting light or rays have been put to practical use. An optical sensor detects light or rays by receiving light or rays radiated from an object to be measured at a photosensitive surface of its photo-detection element. In order to make higher the sensitivity of photo-detection of an optical sensor, it is required to collect light radiated from an object to be measured and to bring the collected light into incidence on the photosensitive surface of the photo-detection element of the optical sensor. For that reason, there is usually put in front of the photosensitive surface of a photo-detection element any light condensation or collection element for efficiently collecting light or rays radiated from an object to be measured and conducting only light within a specified wavelength range to the photosensitive surface thereof.

In the prior art, a lens, waveguide, wavelength filter or the like has been used as such light condensation or collection element. For example, in Japanese Unexamined Patent Application Publication No. 2001-281053 (P2001-281053A) that was published on Oct. 10, 2001, there is disclosed an infrared sensor in which a convex ceramic lens is provided in front of a photo-detection part thereof and infrared radiation or rays collected through the ceramic lens are directed toward the photo-detection part. In Japanese Unexamined Patent Application Publication No. 2001-349785 (P2001-349785A) that was published on Dec. 12, 2001 and Japanese Unexamined Patent Application Publication No. 2002-48646 (P2002-48646A) that was published on Feb. 15, 2002, there is disclosed an infrared sensor in which a binary lens is used as a condensing lens for infrared radiation or rays and a wavelength filter (an infrared radiation coating) that passes therethrough only infrared radiation in a specified wavelength range is formed on the binary lens. In Japanese Unexamined Patent Application Publication No. 2002-48637 (P2002-48637A) that was published on Feb. 15, 2002, there is disclosed an infrared sensor in which received infrared radiation is reflected by a concave reflecting mirror and the reflected infrared radiation is collected to bring it into incidence on the infrared detection element thereof, that is, an infrared sensor in which the photosensitive surface of the infrared detection element is positioned on the rear side of the infrared sensor and received infrared radiation is reflected and collected by use of reflection and condensation elements or parts to bring it into incidence on the photosensitive surface of the infrared detection element. In Japanese Unexamined Patent Application Publication No. 2002-48649 (P2002-48649A) that was published on Feb. 15, 2002, there is disclosed an infrared sensor that has a plurality of lenses and a plurality of infrared detection elements provided therein in order to keep the accuracy of temperature measurement even the case that the optical axis of the infrared sensor is somewhat out of alignment with the optical axis of incident infrared radiation. In Japanese Examined Patent Application Publication No. H05-28617 (P05-28617B) that was published on Apr. 26, 1993 and Japanese Unexamined Patent Application Publication No. H08-191800 (P08-191800A) that was published on Jul. 30, 1996, there is disclosed an infrared sensor that is provided with a waveguide for guiding infrared radiation by a predetermined distance toward the photosensitive surface of the infrared detection element.

Meanwhile, an artificial crystalline material in which mediums each having a different refractive index from one another are periodically disposed is called a photonic crystal, and attracts attention or is watched as a technology that realizes various high-grade optical control elements or parts such as, for example, an element or part showing a super lensing effect due to negative refractive index, an optical waveguide having an abrupt crook with low loss, a microminiaturized optical integrated circuit, etc., that are not realizable by use of known optical materials or substances. The photonic crystal can be used as a light collection or condensation element for electromagnetic wave in any wavelength region in principle by matching a period of refractive index to a wavelength of electromagnetic wave. At present, research on the photonic crystal is actively performed in the technical field of optical communications as a substitute or alternative device for an existing optical element. However, there is no announcement or report on a form or configuration of utilization of element in case of using the photonic crystal as a light collection element until now. The present invention relates to an optical sensor that uses an element having light collecting function in which a photonic crystal is used and a method of manufacturing the optical sensor. Further, hereinafter, an element having light collecting function in which a photonic crystal is used is referred to as photonic crystal lens.

In case a photonic crystal lens is used as a light collection element or part, if the photonic crystal lens per se is manufactured as a single element and the manufactured single element is combined with an infrared sensor or other device to form one body, there are needed steps of manufacturing both of the elements separately and thereafter integrating both after completion of precise alignment thereof. For this reason, there occur problems that the manufacturing process is complicated and the manufacturing cost becomes higher.

In addition, in order to improve the measurement accuracy of an optical sensor, to make the sensitivity thereof higher, to miniaturize the size or shape thereof, and to reduce the manufacturing cost, it is necessary to overcome such conditions that a light condensation or collection element and a photo-detection element must be located to come close to each other as much as possible or to be in contact with each other; a spot of collected light should be made smaller so as to be able to collect light sufficiently in the state that the light collection element and the photo-detection element are located to come close to each other as much as possible or to be in contact with each other; dependence on the incidence angle of light and sensitiveness on the optical axis must be lowered, or alternatively, the incidence angle must be limited to control the directivity depending upon uses thereof; required optical control elements or parts such as lens and wavelength filter should be integrated to manufacture them in one manufacturing process; the accuracy of positional alignment required to integrate the photo-detection element with the light condensation element should be improved; the manufacturing process can be simplified; and the like.

SUMMARY OF THE INVENTION

It is an object of the present invention to provide an optical sensor that uses a photonic crystal lens as a light condensation or collection element and can overcome the above-stated conditions.

It is another object of the present invention to provide a method of manufacturing such optical sensor that uses a photonic crystal lens as a light condensation or collection element.

In order to accomplish the aforesaid objects, there is provided, in one aspect of the present invention, a method of manufacturing an optical sensor which comprises the steps of: manufacturing a photo-detection element; and forming a photonic crystal lens on the surface of the photo-detection element integrally therewith.

In a preferred embodiment, the step of forming a photonic crystal lens on the surface of the photo-detection element integrally therewith comprises: a step of forming a cubic element of photonic crystal on the surface of the photo-detection element integrally therewith; and a step of irradiating a portion of the cubic element of photonic crystal with ultraviolet rays thereby to change the refractive index of the portion of the cubic element that has been irradiated with ultraviolet rays.

In another preferred embodiment, the step of forming a photonic crystal lens on the surface of the photo-detection element integrally therewith comprises: a step of causing globular particles having different refractive indices to eject on the surface of the photo-detection element from an ink-jet apparatus having a nozzle provided with a temperature control part by controlling temperature of the nozzle, and forming a laminate of globular particle layers having different refractive indices.

The manufacturing method may comprises a step of forming a buffer layer on the surface of the photo-detection element before the step of causing globular particles having different refractive indices to eject on the surface of the photo-detection element. The manufacturing method may further comprises a step of removing a region of the buffer layer corresponding to a photo-detection part of the photo-detection element after the step of forming a laminate of globular particle layers having different refractive indices.

The manufacturing method may comprises a step of forming another photonic crystal element on the surface of the photonic crystal lens integrally therewith.

In another aspect of the present invention, there is provided an optical sensor which comprises: a photo-detection element; and a photonic crystal lens formed on the surface of the photo-detection element integrally therewith.

In a preferred embodiment, the photonic crystal lens is formed by partly changing the refractive index of a cubic element of photonic crystal formed on the surface of the photo-detection element integrally therewith.

In another preferred embodiment, the photonic crystal lens is formed by laminating globular particle layers having different refractive indices on the surface of the photo-detection element.

The photonic crystal lens may be formed on the surface of and integrally with a buffer layer formed on the surface of the photo-detection element integrally therewith. A portion of the buffer layer corresponding to a photo-detection part of the photo-detection element may be removed.

Another photonic crystal element may be formed on the surface of the photonic crystal lens integrally therewith to constitute a composite optical sensor.

According to the present invention, a photonic crystal lens is used as a light collection element, and the photonic crystal lens is integrated with a photo-detection element or device. Accordingly, light radiated from an object to be measured can be efficiently collected and only light within a specified wavelength range can be conducted to the photosensitive surface of the photo-detection element. Thus, it is possible to provide a miniaturized optical sensor in which the measurement accuracy thereof is improved, the sensitivity thereof is made higher, and the manufacturing cost can be reduced.

DETAILED DESCRIPTION OF THE PREFERRED EMBODIMENTS

Figure 1:
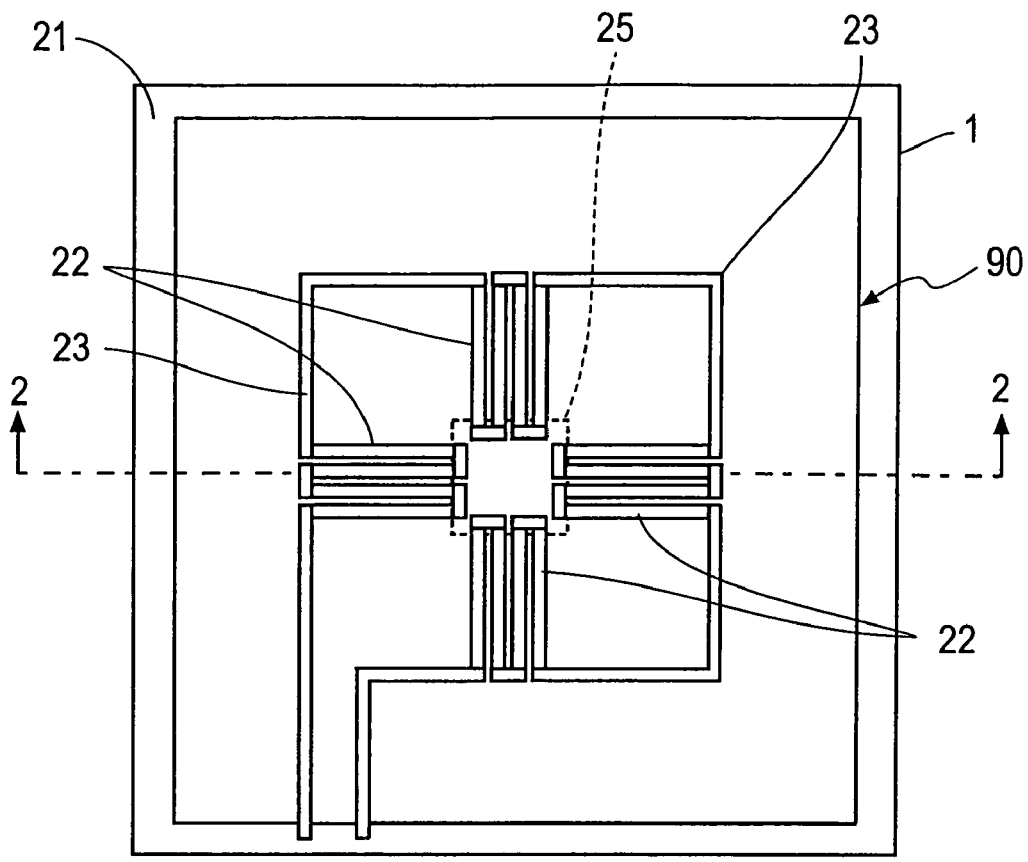
FIG. 1 is a plan view showing a first embodiment of the optical sensor according to the present invention.

In a first embodiment in which the present invention was applied to an infrared sensor, there is provided an infrared sensor that comprises: an infrared detection element for receiving infrared radiation and converting it into an electric signal; a light condensation or collection element for collecting infrared radiation into the infrared detection element; a substrate on the surface of which the infrared detection element is formed; and a photonic crystal lens formed on the upper surface of and integrally with the infrared detection element. Also, in a method of manufacturing such infrared sensor, in order to form a periodic structure of refractive indices of the photonic crystal lens, the method comprises the steps of: forming a three dimensional element of photonic crystal by use of two kinds of materials, one being different in refractive index from the other; and thereafter, irradiating ultraviolet radiation on the three dimensional element of photonic crystal to form the three dimensional element that has portions therein which indicate the third refractive index.

In another embodiment, there is provided an infrared sensor that comprises: an infrared detection element for receiving infrared radiation and converting it into an electric signal; a light condensation or collection element for collecting infrared radiation into the infrared detection element; and a photonic crystal lens formed on the upper surface of and integrally with the infrared detection element and serves as a light condensation or collection element, and wherein the photonic crystal lens is constituted by at least three kinds of materials the refractive indices of which differ from one another, and a medium in which a material having high refractive index such as a silver-containing glass and air are periodically combined, being used as the photonic crystal. Also, a method of manufacturing such infrared sensor comprises the steps of: stacking a globular particle ejected from an ink-jet apparatus to fabricate a photonic crystal lens; and controlling a temperature of a nozzle in ejecting a globular particle to make a refractive index of the ejected globular particle change.

In still another embodiment, there is provided an infrared sensor that comprises: an infrared detection element for receiving infrared radiation and converting it into an electric signal; a light condensation or collection element for collecting infrared radiation into the infrared detection element; a buffer layer formed over the upper surface of an infrared absorption layer of the infrared detection element formed on a substrate; and a photonic crystal lens that is formed on the upper surface of and integrally with the buffer layer, and wherein a portion of the buffer layer is removed by energy of infrared radiation that is incident on the photonic crystal lens. Also, a method of manufacturing such infrared sensor comprises the steps of: forming a buffer layer over the upper surface of an infrared absorption layer of an infrared detection element formed on a substrate; forming a photonic crystal lens on the upper surface of and integrally with the buffer layer; and irradiating infrared radiation on the photonic crystal lens and removing a portion of the buffer layer by energy of the incident infrared radiation.

Here, though there are various systems of liquid ejections used in ink-jet apparatus, an ink-jet apparatus of any liquid ejection system may be used. For example, an ink-jet apparatus of a liquid ejection system using a piezoelectric element, of a bubble-jet (trade name) system by heating, of a liquid ejection system such as so-called dispenser, or of other liquid ejection system, may be used.

Now, preferred embodiments of the present invention will be described in detail with reference to the accompanying drawings. This invention may, however, be embodied in many different forms and should not be construed as limited to the embodiments set forth hereinafter; rather, these embodiments are provided so that this disclosure will be thorough and complete, and will fully convey the scope of the invention to those skilled in the art.

EXAMPLE 1

At first, a first embodiment of the optical sensor according to the present invention will be described in detail with reference to FIGS. 1 and 2.

Figure 2:
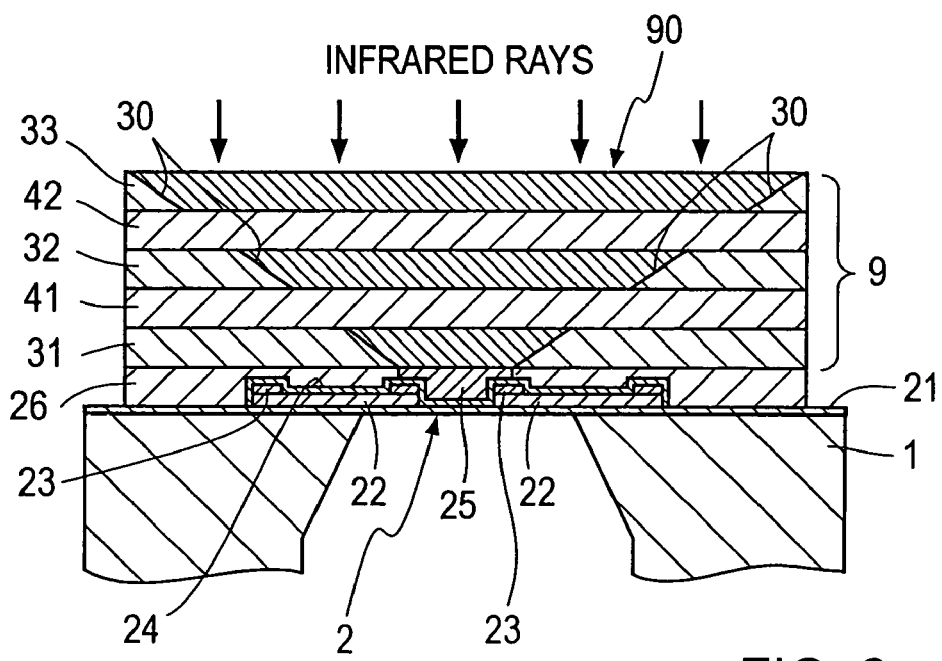
FIG. 2 is a sectional view taken along the line 2—2 in FIG. 1 and looking in the direction indicated by the arrows in FIG. 1.

FIG. 1 is a plan view showing a first embodiment of the optical sensor according to the present invention, and FIG. 2 is a sectional view taken along the line 2—2 in FIG. 1 and looking in the direction indicated by the arrows in FIG. 1. The first embodiment shows a case that the present invention was applied to an infrared sensor.

As a substrate 1, a silicon (Si) substrate having a generally square shape in plan was prepared, over the entire surface of which an insulation layer 21 was formed. A thermopile type infrared detection element or device 2 was formed on the surface of the insulation layer 21 of the substrate 1. In this embodiment, this thermopile type infrared detection element 2 comprises: strip-like thermoelectric material layers 22 that consist of n-type semiconductors and p-type semiconductors constituting four thermocouples formed on the surface of the insulation layer 21 having a generally square shape in plan; and electrode patterns 23 formed on the surface of the insulation layer 21 in order to electrically connect these four thermocouples in series with one another.

The strip-like thermoelectric material layers 22 were formed in such manner that first four of them extend upwardly, second four of them extend downwardly, third four of them extend leftwardly, and fourth or remaining four thermoelectric material layers extend rightwardly in the figure from the center portion of the insulation layer 21 toward the periphery thereof as if they make substantially a cross in plan. Each of the thermoelectric material layers 22 has substantially the same length with one another, and respective four thermoelectric material layers were constituted by two n-type semiconductor strips and two p-type semiconductor strips that were alternately juxtaposed.

The electrode patterns 23 were formed at one end and at the other end of each of the thermoelectric material layers 22 in such manner that they form a generally square shape at the one ends and the other ends thereof as shown in FIG. 1 and that the four thermocouples are electrically connected in series with one another. Respective four thermoelectric material layers constitute one thermopile which consists of two thermocouples that are connected in series with each other by electrically connecting between the one ends, near the center portion of the insulation layer 21, of adjacent one n-type semiconductor strip and one p-type semiconductor strip by the electrode patterns 23 and between the other ends, near the periphery of the insulation layer 21, of the inner side one p-type semiconductor strip and the inner side one n-type semiconductor strip by the electrode patterns 23.

These four thermopiles connected in series with one another by the electrode patterns 23 were set such that junctions thereof near the center portion of the insulation layer 21 were hot junctions and junctions thereof near the periphery of the insulation layer 21 were cold junctions. Further, in order to facilitate the understanding, in FIG. 1, the insulation layer 21, the thermoelectric material layers 22, and the electrode patterns 23 are shown by solid lines, but in actual fact they are not visible because a cubic or three-dimensional element 9 of three-dimensional photonic crystal described later exists above them as will be easily understandable from FIG. 2.

Next, a passivation layer 24 was formed on an area having a generally square shape in plan in which the thermoelectric material layers 22 and the electrode patterns 23 are included so that the surfaces of the thermoelectric material layers 22 and the electrode patterns 23 were covered by the passivation layer 24. In this embodiment, a thin film of $SiO_2$ was formed on the above area of a generally square shape in plan by sputtering thereby to form the passivation layer 24 the principal purpose of which resides in electric insulation. Then, a blackened gold was deposited by evaporation on a central region having a generally square shape in which the eight hot junctions of the thermopile type infrared detection element 2 are included thereby to form an infrared absorption layer 25 for absorbing infrared rays. Further, in order to make higher the efficiency of thermal absorption of the thermoelectric material layers 22, an opening was formed in the substrate 1 at a portion thereof that is located in the underside of the thermoelectric material layers 22.

Since the sixteen strip-like thermoelectric material layers 22 (and portions of the electrode patterns 23 deposited on both ends of each of the thermoelectric material layers 22) and the infrared absorption layer 25 are protruding from the surface of the substrate 1, in this embodiment, after the infrared absorption layer 25 was formed, a SiO2 system sol-gel solution in which alkoxide of silicon was used, was applied on the surface of the substrate by spin coating deposition, and then the coating deposited on the substrate was pressed from its upper side by use of a flat board or substrate not shown, thereby to form a flattened layer 26. Since the infrared absorption layer 25 are protruding higher than the thermoelectric material layers 22 and the electrode patterns 23, the flattened layer 26 was formed, in this embodiment, in such manner that it is substantially flush with the top surface of the infrared absorption layer 25.

Next, there will be described especially with reference to FIG. 2 a process of manufacturing a three-dimensional photonic crystal lens 90 that is a light condensation or collection element, directly on the top surface of the flattened layer 26 formed as stated above.

In this embodiment, a silver-containing glass consisting of a Ag2O—TiO2-SiO2 system sol-gel glass was used as a raw material for making the photonic crystal lens 90. At first, alkoxide of titanium, alkoxide of silicon, and silver nitrate were mixed to prepare a sol-gel solution. This sol-gel solution was applied on the flattened layer 26 (and the infrared absorption layer 25) corresponding to the top surface of the thermopile type infrared detection element 2 by spin-coating deposition to form a sol-gel film. Though a thickness of the sol-gel film depends upon a design of the photonic crystal lens 90, the thickness thereof was set to 3 µm in this embodiment. Thereafter, the sol-gel film was heated to such degree that it shows plasticity while a pressure was being applied to the sol-gel film by use of a flattened board, thereby to form a silver-containing glass layer 31. In such case, there was prepared a mold not shown in which pillars each consisting of Si were periodically arranged and formed in the form of a matrix, the mold having been manufactured by use of lithography and etching techniques, and a silver-containing glass pattern (not shown) was formed by pressing this mold against the silver-containing glass layer 31, wherein the pattern have a thickness of 3 µm, holes (through holes in this embodiment) formed therein a diameter of each of which is 3 µm, and a period (an interval between adjacent two holes in the longitudinal direction (up-and-down direction) and the lateral direction (right-and-left direction)) of 4 µm.

Next, a SiO2 system sol-gel solution containing no silver was applied on the surface of the silver-containing glass pattern of the silver-containing glass layer 31 by spin-coating deposition to form a sol-gel film. The thickness of this sol-gel film was also set to 3 µm. Thereafter, the sol-gel film was heated to such degree that it shows plasticity while a pressure was being applied to the sol-gel film by use of a flattened board, thereby to form a SiO2 glass layer 41. In case of the SiO2 glass layer 41, too, a SiO2 glass pattern (not shown) was formed by pressing the above-mentioned mold against the SiO2 glass layer 41, wherein the pattern have a thickness of 3 µm, holes formed therein a diameter of each of which is 3 µm, and a period of 4 µm. In case of pressing the above-mentioned mold against the SiO2 glass layer 41, the mold was located in such manner that the pillars of Si periodically arranged and formed on the mold in the form of a matrix were suitably positioned relative to the through holes (through holes formed by the pillars of Si of the mold) already formed in the silver-containing glass layer 31 and thereafter pressed.

Subsequently, by application of the same process, a silver-containing glass layer 32 and a silver-containing glass pattern (not shown) were formed, and a SiO2 glass layer 42 and a SiO2 glass pattern (not shown) were formed thereon, and further, a silver-containing glass layer 33 and a silver-containing glass pattern (not shown) were formed thereon, thereby to form the cubic element 9 of three-dimensional photonic crystal. Further, in this embodiment, though the cubic element 9 of three-dimensional photonic crystal has a six-layer structure that includes, in addition to the flattened layer 26, the three silver-containing glass layers 31, 32, 33 and the two SiO2 glass layers 41, 42 that were alternately laminated on the flattened layer 26, the two SiO2 glass layers 41, 42 having a refractive index different from (lower than) that of the three silver-containing glass layers 31, 32, 33, it is needless to say that the number of silver-containing glass layers and the number of SiO2 glass layers may be changed depending upon a design of the photonic crystal lens 90.

Next, the cubic element 9 of three-dimensional photonic crystal constructed as discussed above were irradiated with ultraviolet rays from the top surface thereof by focusing them on an angle indicated by an oblique line 30 (in generally an inverted quadrangular pyramid shape) by use of lenses. By the irradiation of ultraviolet rays, silver metals were separated out in the inside of portions of the silver-containing glass layers 31, 32, 33 that were irradiated with the ultraviolet rays. The precipitate of silver metals results in changes in refractive indices of the silver-containing glass layers. In the example shown in FIG. 2, the oblique line 30 extends from the edge of the top surface of the uppermost silver-containing glass layer 33 to the edge of the top surface of the infrared absorption layer 25 so that the ultraviolet rays will be incident on substantially the whole top surface of the uppermost silver-containing glass layer 33 and reach substantially the whole top surface of the infrared absorption layer 25. As a result, the uppermost silver-containing glass layer 33 has the maximum volume irradiated with the ultraviolet rays, and the lowermost silver-containing glass layer 31 has the minimum volume irradiated with the ultraviolet rays so that the refractive index of the uppermost silver-containing glass layer 33 changes maximally and the refractive index of the lowermost silver-containing glass layer 31 changes minimally. In other words, the silver-containing glass layers 31, 32, 33 have their refractive indices changed in stages.

Changes in the refractive indices of the silver-containing glass layers 31, 32, 33 increase in differences of refractive indices between the silver-containing glass layers and the $SiO_2$ glass layers each of which does not contain silver. In this way, with increased differences of refractive indices between the silver-containing glass layers and the SiO2 glass layers not containing silver, a three-dimensional photonic crystal lens 90 could be manufactured in which an efficient lensing effect was added to the cubic element 9 of three-dimensional photonic crystal.

Since the above-stated three-dimensional photonic crystal lens 90 was formed integrally with the thermopile type infrared detection element 2, the optical sensor of the example 1 can efficiently collect light radiated from an object to be measured and conduct only light within a specified wavelength range to the photosensitive surface of the infrared detection element 2. Thus, it is possible to provide a miniaturized infrared sensor in which the measurement accuracy thereof is improved, the sensitivity thereof is made higher, and the manufacturing cost can be reduced.

EXAMPLE 2

Next, a second embodiment of the optical sensor according to the present invention will be described in detail with reference to FIG. 3. This second embodiment also shows a case that the present invention was applied to an infrared sensor.

Figure 3:
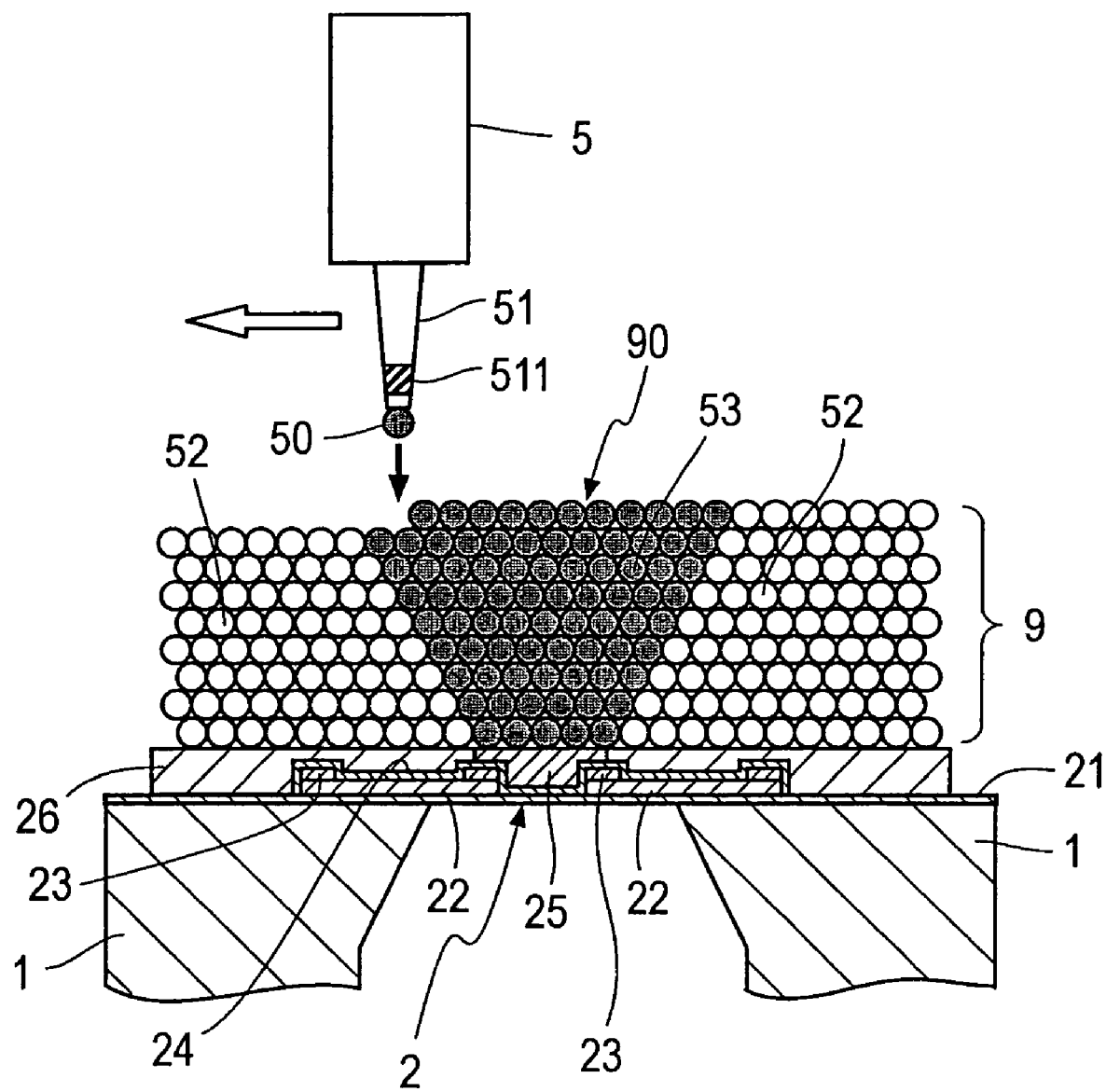
FIG. 3 is a sectional view for explaining a process of manufacturing a second embodiment of the optical sensor according to the present invention with the photonic crystal lens shown in schematic illustrational view.

FIG. 3 is a sectional view similar to FIG. 2 for showing a second embodiment of the optical sensor according to the present invention, and a three-dimensional photonic crystal lens 90 is shown in schematic illustrational view in order to facilitate the understanding thereof. Since a manufacturing process of a thermopile type infrared detection element 2 is the same as that in the first embodiment discussed above, in FIG. 3, elements and portions corresponding to those in FIGS. 1 and 2 will be denoted by the same reference numerals or characters attached thereto and explained briefly.

As a substrate 1, a silicon (Si) substrate having a generally square shape in plan was prepared, the substrate 1 having an insulation layer 21 formed over the entire surface thereof. A thermopile type infrared detection element or device 2 was formed on the surface of the insulation layer 21 of the substrate 1. This thermopile type infrared detection element 2 comprises: strip-like thermoelectric material layers 22 that consist of n-type semiconductors and p-type semiconductors constituting four thermocouples formed on the surface of the insulation layer 21 having a generally square shape in plan; and electrode patterns 23 formed on the surface of the insulation layer 21 at the peripheral portion and the central portion thereof, each electrode pattern having a generally square shape, in order to electrically connect these four thermocouples in series with one another.

Then, a passivation layer 24 was formed on an area having a generally square shape in plan in which the thermoelectric material layers 22 and the electrode patterns 23 are included so that the surfaces of the thermoelectric material layers 22 and the electrode patterns 23 were covered by the passivation layer 24. In this second embodiment, too, a thin film of $SiO_2$ was formed on the above area of a generally square shape in plan by sputtering thereby to form the passivation layer 24 the principal purpose of which resides in electric insulation. Next, a blackened gold was deposited by evaporation on a central region having a generally square shape in which the eight hot junctions of the thermopile type infrared detection element 2 are included thereby to form an infrared absorption layer 25 for absorbing infrared rays.

Like the first embodiment, in this second embodiment, after the infrared absorption layer 25 was formed, a $SiO_2$ system sol-gel solution in which alkoxide of silicon was used, was applied on the surface of the substrate including the passivation layer and the infrared absorption layer by spin coating deposition, and then the substrate having the coating was pressed from its upper side by use of a flat board not shown, thereby to form a flattened layer 26. The flattened layer 26 was also formed, in this embodiment, in such manner that it is substantially flush with the top surface of the infrared absorption layer 25.

Next, there will be described a process of manufacturing the three-dimensional photonic crystal lens 90 that is a light condensation or collection element, directly on the top surface of the flattened layer 26 formed as stated above.

In the second embodiment, a silver-containing glass consisting of a $Ag_2O$—$TiO_2$—$SiO_2$ system sol-gel glass was also used as a raw material for making the photonic crystal lens 90. At first, alkoxide of titanium, alkoxide of silicon, and silver nitrate were mixed to prepare a sol-gel solution. This sol-gel solution was filled into an ink jet apparatus or machine 5 which will ejects a globular particle 50 of the sol-gel solution from its nozzle 51. The globular particle 50 ejected from the ink jet apparatus 5 was put on the flattened layer 26 corresponding to the top surface of the thermopile type infrared detection element 2 and piled up in three-dimensional manner as shown. In this case, the nozzle 51 was adjusted such that a diameter of the globular particle 50 comes to 4 μm.

The nozzle 51 of the ink jet apparatus 5 has a temperature control part 511 mounted thereto near the ejection end thereof. Temperature of the nozzle 51 of the ink jet apparatus 5 can be controlled by the temperature control part 511 so that silver metal can be separated out in the ejected globular particle 50 of the sol-gel solution. In this second embodiment, the globular particle 50 was piled up on the top surface of the flattened layer 26 in three-dimensional manner by controlling temperature of the nozzle 51 of the ink jet apparatus 5 in such manner that a particle layer 53 having high refractive index can be formed on a portion of the top surface of the flattened layer 26 corresponding to the top surface of the infrared absorption layer 25 in a generally inverted frustum of pyramid-like shape therefrom and a particle layer 52 having low refractive index can be formed on the remaining portion of the top surface of the flattened layer, as show in FIG. 3, thereby to manufacture the three-dimensional photonic crystal lens 90 in which an efficient lensing effect was added to the cubic element 9 of three-dimensional photonic crystal. That is, since temperature of the nozzle at which silver metal is separated out in the sol-gel glass, is about 350° C. or higher than 350° C., in the area on which the particle layer 53 having high refractive index is to be formed, temperature of the nozzle 51 was set to about 350° C. or higher than 350° C. so that silver metal is separated out in the ejected globular particle 50 of the sol-gel solution and in other area, temperature of the nozzle 51 was set to one lower than 350° C. so that silver metal is not separated out in the ejected globular particle 50 of the sol-gel solution.

In this way, with patterning of the particle layer 52 having low refractive index and the particle layer 53 having high refractive index, the three-dimensional photonic crystal lens 90 could be manufactured in which an efficient lensing effect was added to the cubic element 9 of three-dimensional photonic crystal.

Since the above-stated three-dimensional photonic crystal lens 90 was formed integrally with the thermopile type infrared detection element 2, the optical sensor of the example 2 can also efficiently collect light radiated from an object to be measured and conduct only light within a specified wavelength range to the photosensitive surface of the infrared detection element 2. Thus, it is possible to provide a miniaturized infrared sensor in which the measurement accuracy thereof is improved, the sensitivity thereof is made higher, and the manufacturing cost can be reduced.

EXAMPLE 3

Next, a third embodiment of the optical sensor according to the present invention will be described in detail with reference to FIGS. 4 to 7. This third embodiment also shows a case that the present invention was applied to an infrared sensor.

Figure 4:
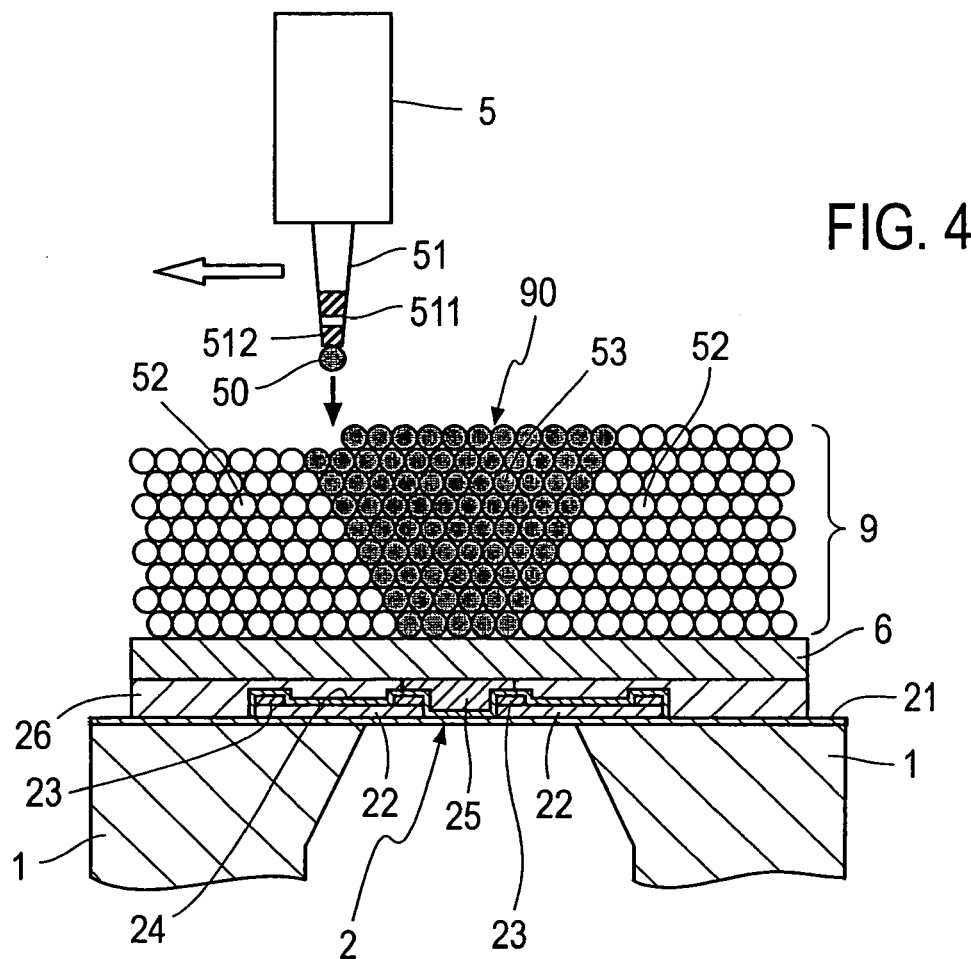
FIG. 4 is a sectional view similar to FIG. 3 for explaining a process of manufacturing a third embodiment of the optical sensor according to the present invention.

FIG. 4 is a sectional view similar to FIG. 3 for showing a third embodiment of the optical sensor according to the present invention, and a three-dimensional photonic crystal lens 90 is shown in schematic illustrational view in order to facilitate the understanding thereof. Since a manufacturing process of a thermopile type infrared detection element 2 is the same as that in the first embodiment discussed above, detailed discussion will be omitted. Further, in FIGS. 4 to 7, elements and portions corresponding to those in FIG. 3 will be denoted by the same reference numerals or characters attached thereto.

As a substrate 1, a silicon (Si) substrate having a generally square shape in plan was prepared, the substrate 1 having an insulation layer 21 formed over the entire surface thereof. A thermopile type infrared detection element or device 2 was formed on the surface of the insulation layer 21 of the substrate 1. This thermopile type infrared detection element 2 comprises: strip-like thermoelectric material layers 22 that are formed on the surface of the insulation layer 21 having a generally square shape in plan, and consist of n-type semiconductors and p-type semiconductors constituting four thermocouples; and electrode patterns 23 that are formed on the surface of the insulation layer 21 at the peripheral portion and the central portion thereof, each electrode pattern having a generally square shape, in order to electrically connect these four thermocouples in series with one another.

Then, a passivation layer 24 was formed on an area having a generally square shape in plan in which the thermoelectric material layers 22 and the electrode patterns 23 are included so that the surfaces of the thermoelectric material layers 22 and the electrode patterns 23 were covered by the passivation layer 24. In this third embodiment, a thin film of $SiO_2$ was also formed on the above area of a generally square shape in plan by a sputtering thereby to form the passivation layer 24 the principal purpose of which resides in electric insulation. Next, a blackened gold was deposited by evaporation on a central region having a generally square shape in which the eight hot junctions of the thermopile type infrared detection element 2 are included thereby to form an infrared absorption layer 25 for absorbing infrared rays.

In this third embodiment, after the infrared absorption layer 25 was formed, a $SiO_2$ system sol-gel solution in which alkoxide of silicon was used, was also applied on the surface of the substrate including the passivation layer and the infrared absorption layer by spin coating deposition, and then the substrate having the coating was pressed from its upper side by use of a flat board not shown, thereby to form a flattened layer 26. The flattened layer 26 was also formed, in this embodiment, in such manner that it is substantially flush with the top surface of the infrared absorption layer 25.

Next, there will be described a process of manufacturing the three-dimensional photonic crystal lens 90 that is a light condensation or collection element, directly on the top surface of the flattened layer 26 formed as stated above.

At first, a buffer layer 6 was stuck on the top surfaces of the flattened layer 26 and the infrared absorption layer 25, the buffer layer 6 consisting of a sheet of a thermoplastic adhesive. As a thermoplastic adhesive sheet, there can be used, for example, a film type (50 μm in thickness) thermoplastic adhesive "STAYSTIK" (trade name) manufactured by Techno Alpha Co., Ltd. Though a buffer layer having any characteristic such as electrically conductive, electrically insulative or the like can be selected as the buffer layer 6, an adhesive sheet of electrically insulative and high thermal conductive type was selected as the buffer layer 6 in this third embodiment. The reason is that this type of adhesive sheet can be stuck directly on the circuit patterns of the thermopile type infrared detection element 2 and also functions as a heat sink for the cold junctions of the thermopile type infrared detection element 2.

On the top surface of the buffer layer 6 of thermoplastic adhesive sheet was formed the three-dimensional photonic crystal lens 90 in a similar way to that of the second embodiment.

As a raw material for making the photonic crystal lens 90, in the third embodiment, a silver-containing glass consisting of a $Ag_2O$—$TiO_2$—$SiO_2$ system sol-gel glass was also used. At first, alkoxide of titanium, alkoxide of silicon, and silver nitrate were mixed to prepare a sol-gel solution. This sol-gel solution was filled into an ink jet apparatus or machine 5 which will ejects a globular particle 50 of the sol-gel solution from its nozzle 51. The globular particle 50 ejected from the ink jet apparatus 5 was put on the flattened layer 26 corresponding to the top surface of the thermopile type infrared detection element 2 and piled up in three-dimensional manner as shown. In this case, the nozzle 51 was adjusted such that a diameter of the globular particle 50 comes to 4 μm.

As described above, it is possible to precipitate silver metal in the ejected globular particle 50 of the sol-gel solution by controlling temperature of the nozzle 51 of the ink jet apparatus 5. In order to precipitate silver metal in the sol-gel glass, the ejection end of the nozzle must be heated to a temperature of about 350° C. or higher than 350° C. Since a material or substance having its reflow temperature of about 170° C. was used as the buffer layer 6, if the globular particle 50 heated to a temperature of about 350° C. or higher than 350° C. should be directly deposited on the buffer layer 6, the buffer layer 6 will be dissolved. For that reason, it is required to cool temperature of the globular particle 50 ejected from the nozzle 51 of the ink jet apparatus 5 down to a temperature of about 170° C. or lower than 170° C. before the globular particle 50 reaches the buffer layer 6. In this embodiment, the shape and structure of the nozzle 51 of the ink jet apparatus 5 was elaborated such that a temperature control part 512 for cooling was added at the ejection end of the nozzle immediately downstream from the above-mentioned temperature control part 511, as shown, and the ejected globular particle 50 was cooled in its temperature down to about 170° C. and deposited on the buffer layer 6. Alternatively, temperature of the globular particle 50 ejected from the nozzle 51 of the ink jet apparatus 5 may be cooled down to a temperature of about 170° C. or lower than 170° C. by making environmental temperature lower, without adding the temperature control part 512 for cooling.

Figure 5:
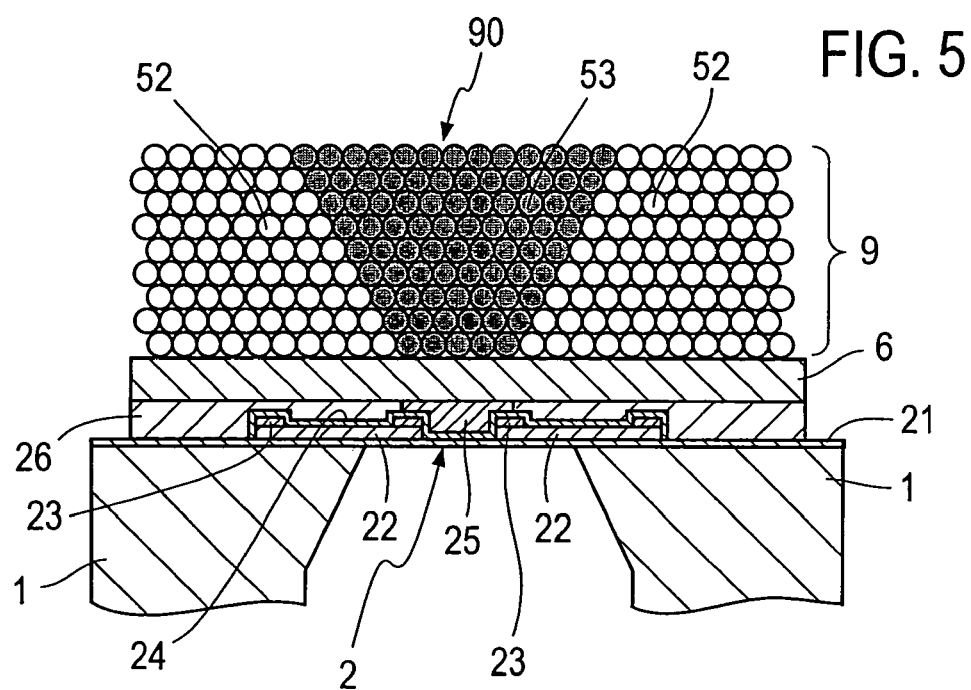
FIG. 5 is a sectional view for explaining another process of manufacturing the third embodiment of the optical sensor according to the present invention.

In this third embodiment, as shown in FIG. 5, the globular particle 50 was piled up on the top surface of the buffer layer 6 in three-dimensional manner by controlling temperature of the nozzle 51 of the ink jet apparatus 5 in such manner that a particle layer 53 having high refractive index can be formed on a portion of the top surface of the buffer layer 6 corresponding to the top surface of the infrared absorption layer 25 in a generally inverted frustum of pyramid-like shape therefrom and a particle layer 52 having low refractive index can be formed on the remaining portion of the top surface of the buffer layer, thereby to manufacture the three-dimensional photonic crystal lens 90 in which an efficient lensing effect was added to the cubic element 9 of three-dimensional photonic crystal.

Figure 6:
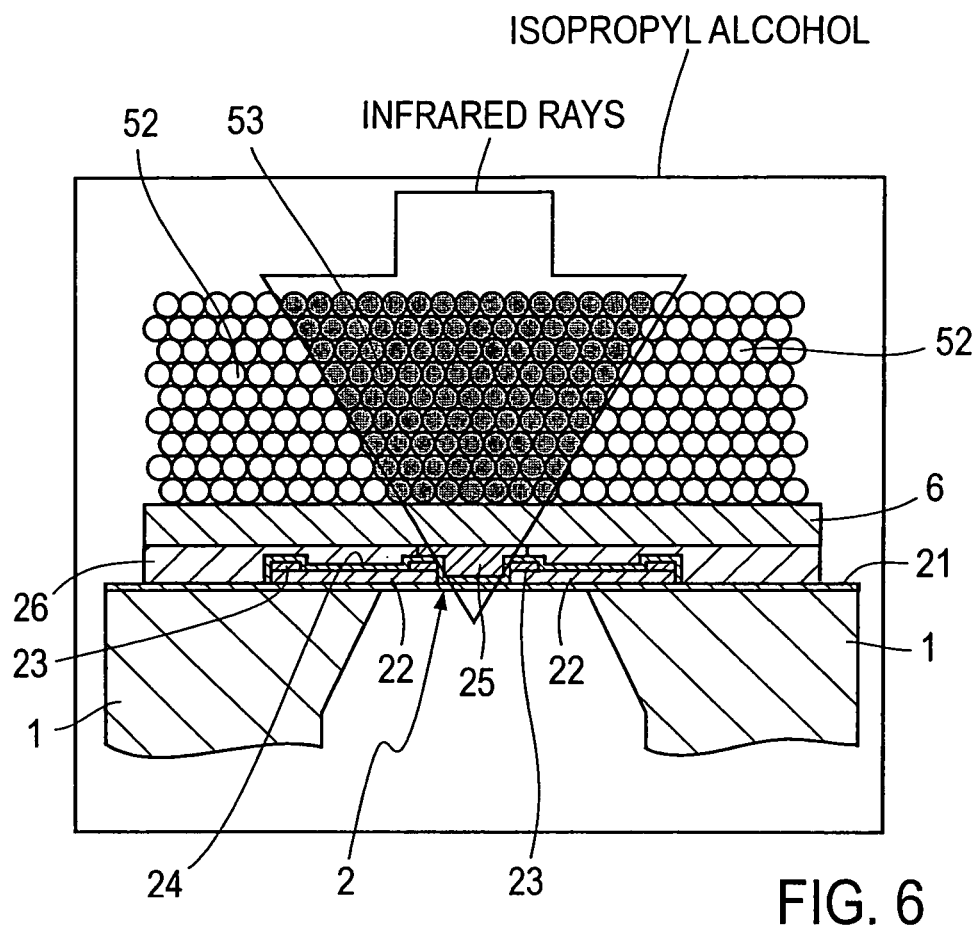
FIG. 6 is a sectional view for explaining further process of manufacturing the third embodiment of the optical sensor according to the present invention.
Figure 7:
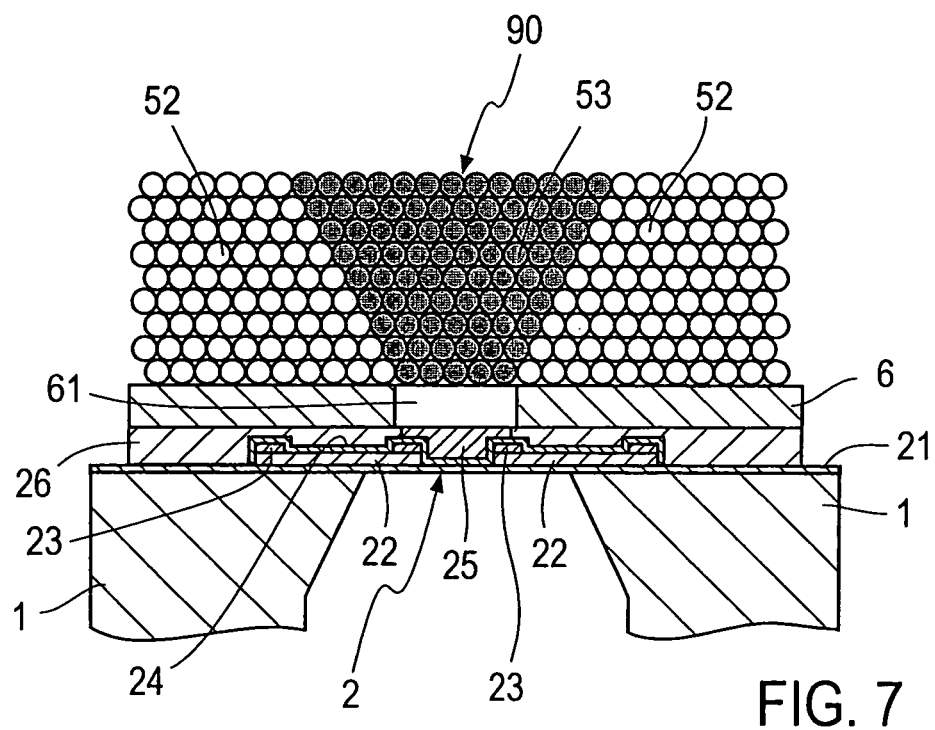
FIG. 7 is a sectional view showing the third embodiment of the optical sensor according to the present invention.
Figure 8:
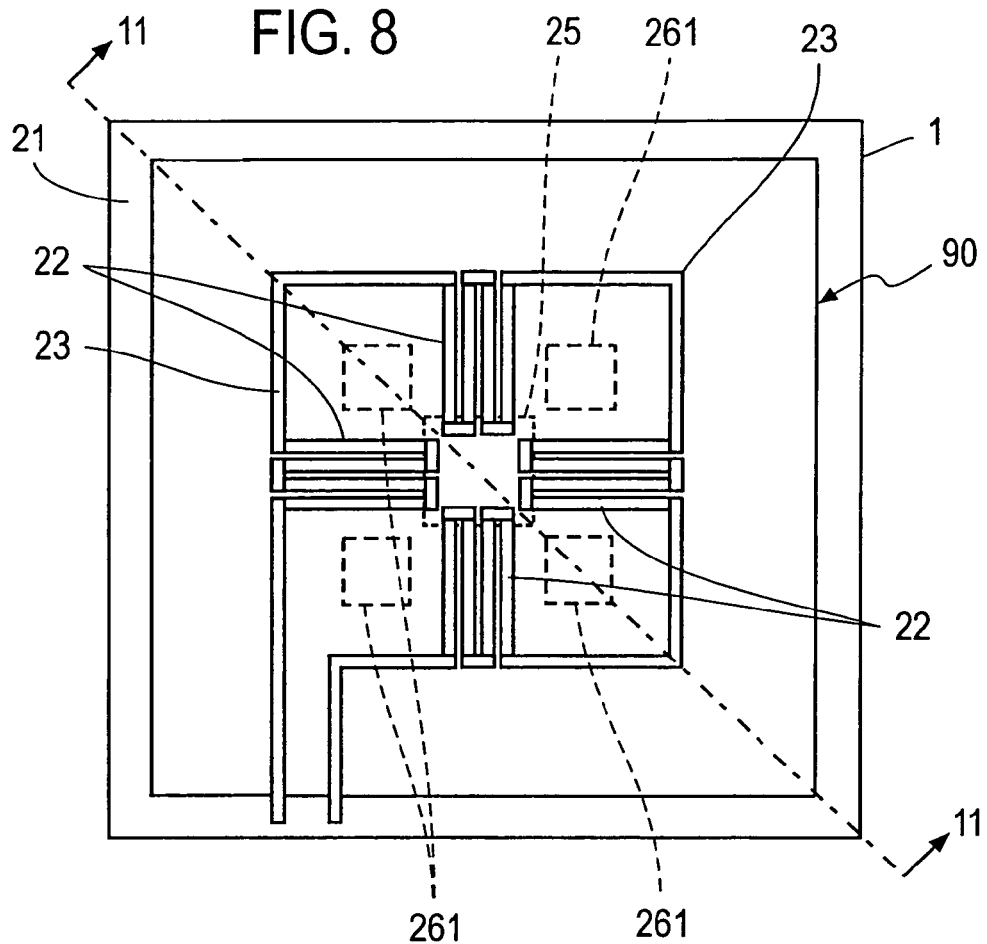
FIG. 8 is a plan view showing a fourth embodiment of the optical sensor according to the present invention.

After the three-dimensional photonic crystal lens 90 was formed in such manner, a portion of the buffer layer 6 that is lying on the top surface of the infrared absorption layer 25 was removed. At first, as shown in FIG. 6, the three-dimensional photonic crystal lens 90 was irradiated with infrared rays from the top surface thereof in a generally inverted quadrangular pyramid-like shape as shown by an arrow so that the infrared absorption layer 25 was irradiated through the particle layer 53 having high refractive index of the photonic crystal lens 90. This irradiation of the infrared rays caused temperature of the infrared absorption layer 25 to rise up to the reflow temperature (about 170° C.) or thermolysis temperature (about 200° C.), thereby to heat the buffer layer portion that is lying on the top surface of the infrared absorption layer 25. This heating step was carried out in an isopropyl alcohol, and the buffer layer portion that is lying on the top surface of the infrared absorption layer 25 and consists of the above-mentioned material was dissolved and removed. In this way, as shown in FIG. 7, only the buffer layer portion that is lying on the top surface of the infrared absorption layer 25 could be removed by making adroit use of the photonic crystal lens 90.

With the construction as discussed above, an air layer 61 exists above the infrared absorption layer 25. Since air has much lower thermal conductivity, heat absorbed by the infrared absorption layer 25 is hardly conducted to the upper side, and a fall in temperature due to thermal conduction becomes very small. For that reason, the infrared absorption layer 25 absorbs infrared rays incident thereon and efficiently rises in its temperature so that the hot junctions of the thermopile type infrared detection element 2 are heated by thermal conduction. Accordingly, the infrared optical sensor can be remarkably increased in its sensitivity and efficiency. On the other hand, it is preferable that the cold junctions of the thermopile type infrared detection element 2 is maintained at a temperature substantially equal to the ambient temperature by providing a heat sink. In this third embodiment, the buffer layer 6 was made of a material or substance having high thermal conductivity and also functions as a heat sink. Therefore, it is easy to maintain temperature of the cold junctions of the thermopile type infrared detection element 2 at substantially the same as the ambient temperature.

Since the above-stated three-dimensional photonic crystal lens 90 was formed integrally with the thermopile type infrared detection element 2, the optical sensor of the example 3 can also efficiently collect light radiated from an object to be measured and conduct only light within a specified wavelength range to the photosensitive surface of the infrared detection element 2. Thus, it is possible to provide a miniaturized infrared sensor in which the measurement accuracy thereof is improved, the sensitivity thereof is made higher, and the manufacturing cost can be reduced.

EXAMPLE 4

Next, a fourth embodiment of the optical sensor according to the present invention will be described in detail with reference to FIGS. 8 to 11. This fourth embodiment also shows a case that the present invention was applied to an infrared sensor.

In the above third embodiment, in order to remove a portion of the buffer layer 6 lying on the top surface of the infrared absorption layer 25, isopropyl alcohol was used. The fourth embodiment merely differs from the above third embodiment mainly in a process of removing a portion of the buffer layer 6 lying on the top surface of the infrared absorption layer 25. Therefore, in FIGS. 8 to 11, elements and portions corresponding to those in FIGS. 4 to 7 will be denoted by the same reference numerals or characters attached thereto and explanation thereof will be omitted unless necessary.

In the third embodiment, in order to remove a portion of the buffer layer 6 lying on the top surface of the infrared absorption layer 25, isopropyl alcohol was used, but in this fourth embodiment, isopropyl alcohol is not used. To this end, as shown in plan view of FIG. 8, in the fourth embodiment, there were previously formed a plurality of (four in this embodiment) recesses 261 by use of lithography and etching techniques, in which a portion of the buffer layer 6 lying on the top surface of the infrared absorption layer 25 is to be collected when it is dissolved, the recesses 261 being formed at portions of the flattened layer 26 that are situated outside the infrared absorption layer 25 and on which the thermopile type infrared detection element 2 has not been formed. It is preferred that these recesses 261 are formed near the periphery of the infrared absorption layer 25. Further, in FIG. 8, an insulation layer 21, thermoelectric material layers 22, and electrode patterns 23 are shown by solid lines, but in actual fact they are not visible because a three-dimensional photonic crystal lens 90 described later exists above them as will be easily understandable from FIGS. 9 to 11 taken along about one diagonal line.

At first, four recesses were formed in a silicon (Si) substrate 1 having a generally square shape in plan. It goes without saying that these recesses were formed at positions on the substrate 1 corresponding to the recesses 261 in which a portion of the buffer layer is to be collected. Then, an insulation layer 21 was formed over the entire surface of the substrate 1, and on the insulation layer 21 were successively formed the thermopile type infrared detection element or device 2, the electrode patterns 23, the infrared absorption layer 25, and the flattened layer 26 by use of the same manufacturing process as that in the third embodiment.

Figure 9:
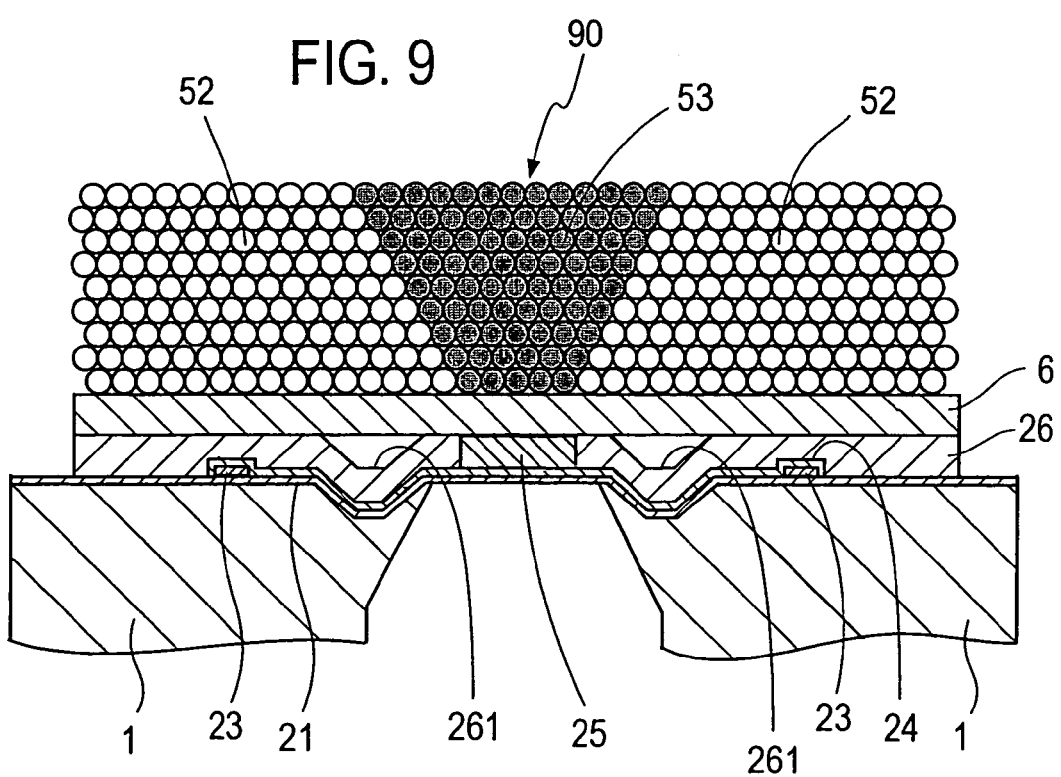
FIG. 9 is a sectional view taken along about one diagonal line for explaining a process of manufacturing the fourth embodiment of the optical sensor according to the present invention.

In this embodiment, the flattened layer 26 was also formed in such manner that it is substantially flush with the top surface of the infrared absorption layer 25. As a result, as shown in FIG. 9, there were formed the recesses 261 in which a portion of the buffer layer is to be collected when it is dissolved, at portions of the flattened layer 26 that are situated outside the infrared absorption layer 25 and on which the thermopile type infrared detection element 2 has not been formed.

Next, there will be described a process of manufacturing the three-dimensional photonic crystal lens 90 that is a light condensation or collection element, directly on the top surface of the flattened layer 26 formed as stated above.

At first, a buffer layer 6 was stuck on the top surfaces of the flattened layer 26 and the infrared absorption layer 25, the buffer layer 6 consisting of a sheet of a thermoplastic adhesive. This thermoplastic adhesive sheet is the same material or substance as that used in the third embodiment, and an adhesive sheet of electrically insulative and high thermal conductive type was selected as the buffer layer 6.

On the top surface of the buffer layer 6 of thermoplastic adhesive sheet was formed the three-dimensional photonic crystal lens 90 in a similar way to that of the third embodiment. A raw material and a manufacturing process of the photonic crystal lens 90, etc. are the same as those in the third embodiment and explanation thereof will be omitted. As shown in FIG. 9, a globular particle was piled up on the top surface of the buffer layer 6 in three-dimensional manner by controlling temperature of a nozzle (not shown) of an ink jet apparatus (not shown) in such manner that a particle layer 53 having high refractive index can be formed on a portion of the top surface of the buffer layer 6 corresponding to the top surface of the infrared absorption layer 25 in a generally inverted frustum of pyramid-like shape therefrom and a particle layer 52 having low refractive index can be formed on the remaining portion of the top surface of the buffer layer, thereby to manufacture the three-dimensional photonic crystal lens 90 in which an efficient lensing effect was added to the cubic element 9 of three-dimensional photonic crystal.

Figure 10:
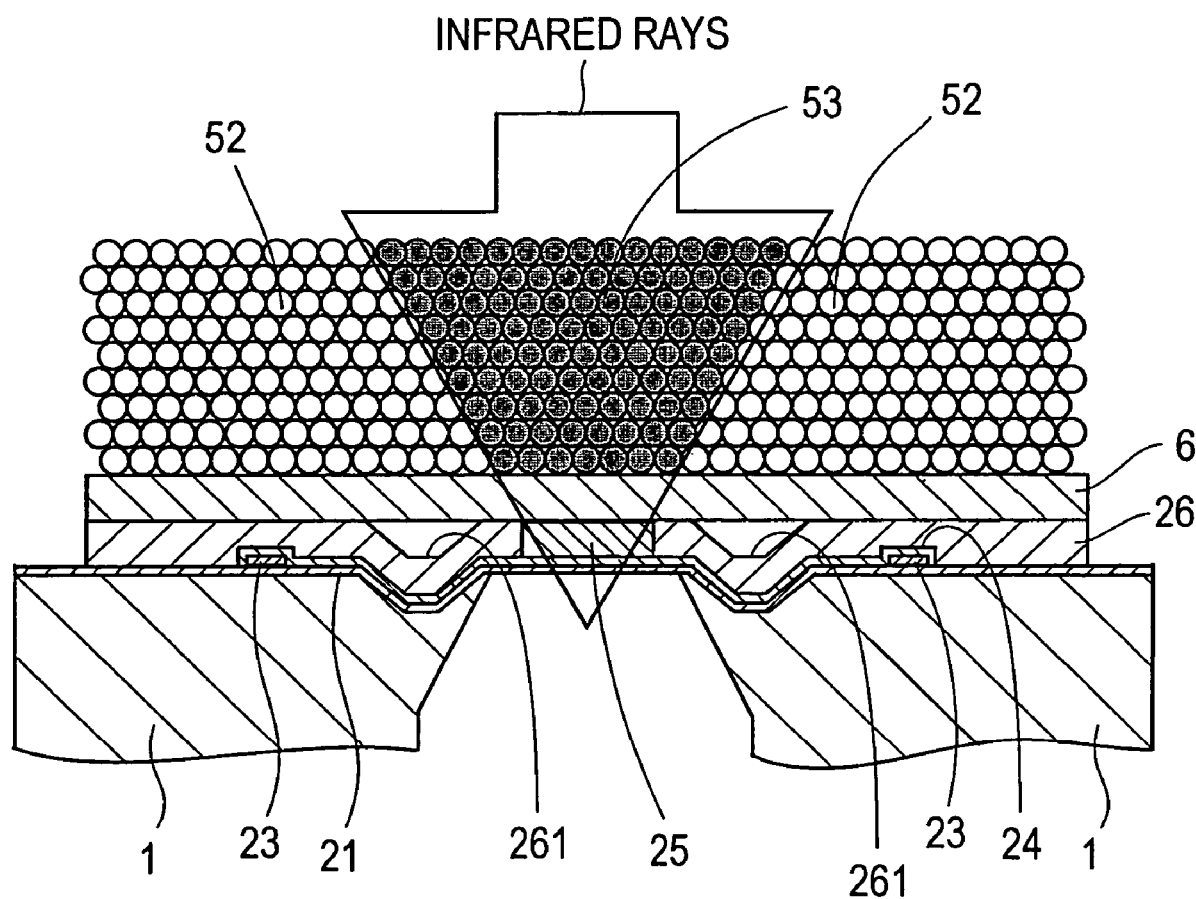
FIG. 10 is a sectional view similar to FIG. 9 for explaining another process of manufacturing the fourth embodiment of the optical sensor according to the present invention.
Figure 11:
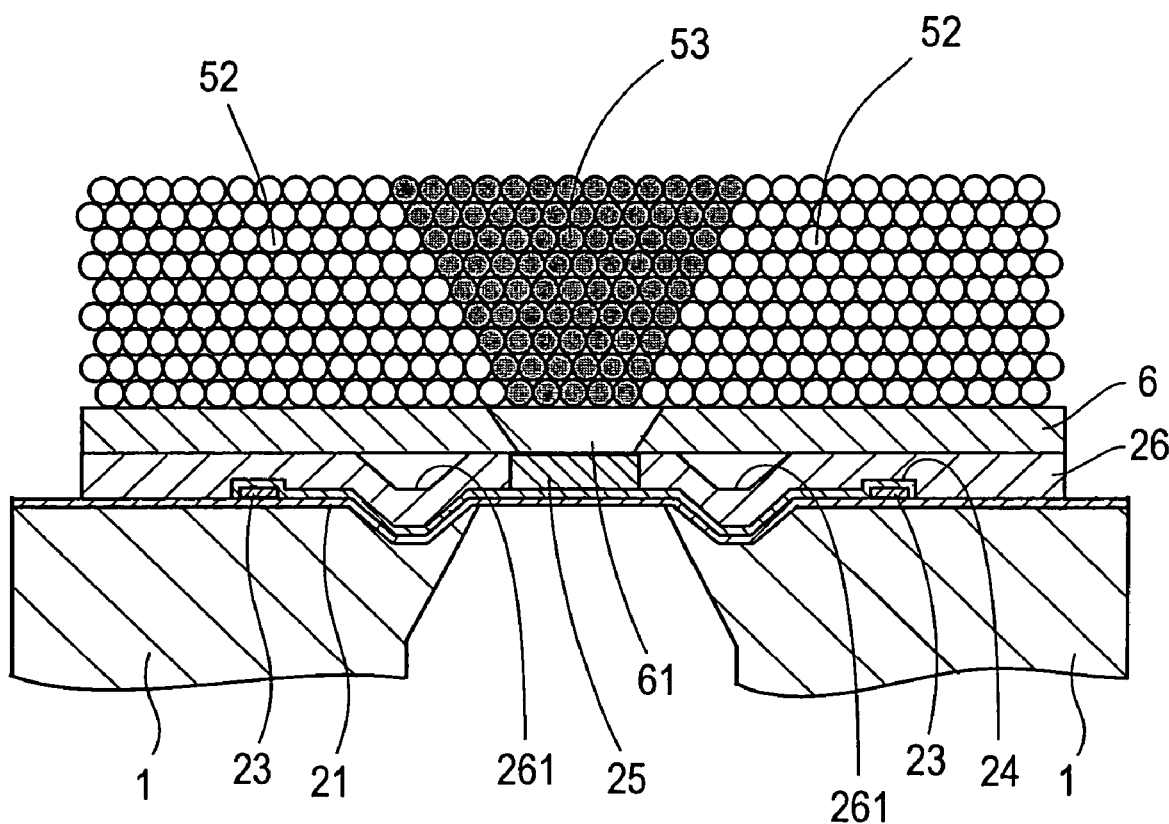
FIG. 11 is a sectional view taken along the line 11—11 in FIG. 8 and looking in the direction indicated by the arrows in FIG. 8.

After the three-dimensional photonic crystal lens 90 was formed in such manner, a portion of the buffer layer 6 that is lying on the top surface of the infrared absorption layer 25 was removed. At first, as shown in FIG. 10, the three-dimensional photonic crystal lens 90 was irradiated with infrared rays from the top surface thereof in a generally inverted quadrangular pyramid-like shape as shown by an arrow so that the infrared absorption layer 25 was irradiated through the particle layer 53 having high refractive index of the photonic crystal lens 90. This irradiation of the infrared rays caused temperature of the infrared absorption layer 25 to rise up to the reflow temperature (about 170° C.) or thermolysis temperature (about 200° C.), thereby to heat the buffer layer portion that is lying on the top surface of the infrared absorption layer 25. The buffer layer portion that is lying on the top surface of the infrared absorption layer 25 and consists of the above-mentioned material was dissolved by this heating step, and the dissolved buffer layer portion was run into the four recesses 261 and removed. In this way, by making adroit use of the photonic crystal lens 90, as shown in FIG. 11, only the buffer layer portion that is lying on the top surface of the infrared absorption layer 25 could be removed.

With the construction as discussed above, like the third embodiment, an air layer 61 exists above the infrared absorption layer 25. Since air has much lower thermal conductivity, heat absorbed by the infrared absorption layer 25 is hardly conducted to the upper side, and a fall in temperature due to thermal conduction becomes very small. For that reason, the infrared absorption layer 25 absorbs infrared rays incident thereon and efficiently rises in its temperature so that the hot junctions of the thermopile type infrared detection element 2 are heated by thermal conduction. Accordingly, the infrared optical sensor can be remarkably increased in its sensitivity and efficiency. On the other hand, in this fourth embodiment, the buffer layer 6 was made of a material or substance having high thermal conductivity and also functions as a heat sink. Therefore, it is easy to maintain temperature of the cold junctions of the thermopile type infrared detection element 2 at substantially the same as the ambient temperature.

Since the above-stated three-dimensional photonic crystal lens 90 was formed integrally with the thermopile type infrared detection element 2, the optical sensor of the example 4 can also efficiently collect light radiated from an object to be measured and conduct only light within a specified wavelength range to the photosensitive surface of the infrared detection element 2. Thus, it is possible to provide a miniaturized infrared sensor in which the measurement accuracy thereof is improved, the sensitivity thereof is made higher, and the manufacturing cost can be reduced.

EXAMPLE 5

Figure 12:
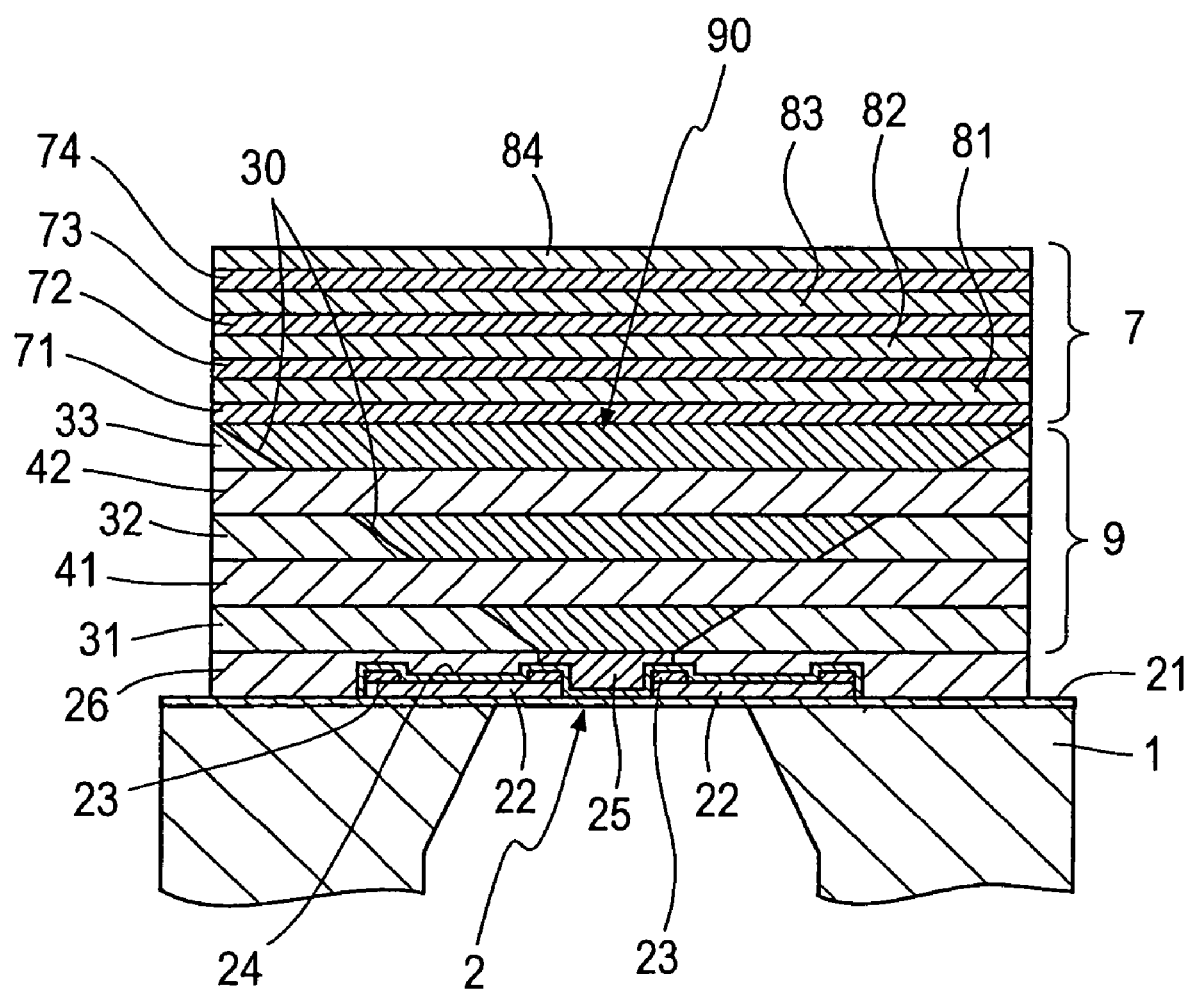
FIG. 12 is a plan view showing a fifth embodiment of the optical sensor according to the present invention.

Next, a fifth embodiment of the optical sensor according to the present invention will be described in detail with reference to FIG. 12. This fifth embodiment also shows a case that the present invention was applied to an infrared sensor.

This fifth embodiment shows a case in which a photonic crystal filter 7 is further formed on the top surface of and integrally with the three-dimensional photonic crystal lens 90 in the infrared sensor of the first embodiment already explained with reference to FIGS. 1 and 2. Accordingly, in FIG. 12, elements and portions corresponding to those in FIGS. 1 and 2 will be denoted by the same reference numerals or characters attached thereto and explanation thereof will be omitted unless necessary. In addition, a manufacturing process of a thermopile type infrared detection element 2 and a manufacturing process of a three-dimensional photonic crystal lens 90 are the same as those in the first embodiment, and explanation thereof will be omitted.

After the three-dimensional photonic crystal lens 90 was manufactured by use of the same manufacturing process as that in the first embodiment, in this embodiment, at first, a $SiO_2$ system sol-gel solution containing no silver was prepared and applied on the top surface of the three-dimensional photonic crystal lens 90 by spin-coating deposition to form a sol-gel film of 2 μm thick, and this sol-gel film was heated to such degree that it shows plasticity while a pressure was being applied to the sol-gel film by use of a flattened board, thereby to form a first $SiO_2$ glass layer 71. Then, alkoxide of titanium, alkoxide of silicon, and silver nitrate were mixed to prepare a sol-gel solution. This sol-gel solution was applied on the top surface of the first $SiO_2$ glass layer 71 by spin-coating deposition to form a sol-gel film of 2 μm thick, and this sol-gel film was heated to such degree that it shows plasticity while a pressure was being applied to the sol-gel film by use of a flattened board, thereby to form a first silver-containing glass layer 81 consisting of a $Ag_2O$—$TiO_2$—$SiO_2$ system sol-gel glass. Subsequently, by application of the same process, a second $SiO_2$ glass layer 72 of 2 μm thick was formed on the top surface of the first silver-containing glass layer 81, and then a second silver-containing glass layer 82 of 2 μm thick was formed on the top surface of the second $SiO_2$ glass layer 72, a third $SiO_2$ glass layer 73 of 2 μm thick was formed on the second silver-containing glass layer 82 and then a third silver-containing glass layer 83 of 2 μm thick was formed on the top surface of the third $SiO_2$ glass layer 73, and further, a fourth $SiO_2$ glass layer 74 of 2 μm thick was formed on the third silver-containing glass layer 83 and then a fourth silver-containing glass layer 84 of 2 μm thick was formed on the top surface of the fourth $SiO_2$ glass layer 74, thereby to form the photonic crystal filter 7.

In the fifth embodiment, on the top surface of the three-dimensional photonic crystal lens 90 was formed the photonic crystal filter 7 having a eight-layer structure that includes the four $SiO_2$ glass layers 71, 72, 73, 74 and the four silver-containing glass layers 81, 82, 83, 84 having a refractive index different from (higher than) that of the four $SiO_2$ glass layers by alternately laminating a $SiO_2$ glass layer of 2 μm thick and a silver-containing glass layer of 2 μm thick, and there was given thereto a characteristic similar to that of a band-pass filter that selects only a required wavelength range in infrared rays. It is needless to say that the number of $SiO_2$ glass layers and the number of silver-containing glass layers may be changed depending upon a design of the photonic crystal filter 7. In addition, the thickness of each $SiO_2$ glass layer and the thickness of each silver-containing glass layer may be also changed depending upon a design of the photonic crystal filter 7, and there may be a case that the thickness of each $SiO_2$ glass layer differs from that of each silver-containing glass layer.

Though the fifth embodiment is a composite sensor, the above-stated photonic crystal filter 7 is about 16 μm in thickness, and hence the whole of the sensor can be miniaturized. In addition, the photonic crystal filter 7 transmits infrared rays more than 90% of incident infrared rays, and there hardly occurs optical loss. Moreover, the three-dimensional photonic crystal lens 90 was formed integrally with the thermopile type infrared detection element 2, and the photonic crystal filter 7 was formed on the top surface of and integrally with the three-dimensional photonic crystal lens 90. Accordingly, the optical sensor of the example 5 can efficiently collect light in a wavelength range selected by the photonic crystal filter 7 among light radiated from an object to be measured and efficiently conduct only light within a specified wavelength range to the photosensitive surface of the infrared detection element 2. Thus, it is possible to provide a miniaturized infrared sensor in which the measurement accuracy thereof is improved, the sensitivity thereof is made higher, and the manufacturing cost can be reduced.

COMPARISON EXAMPLE 1

Figure 13:
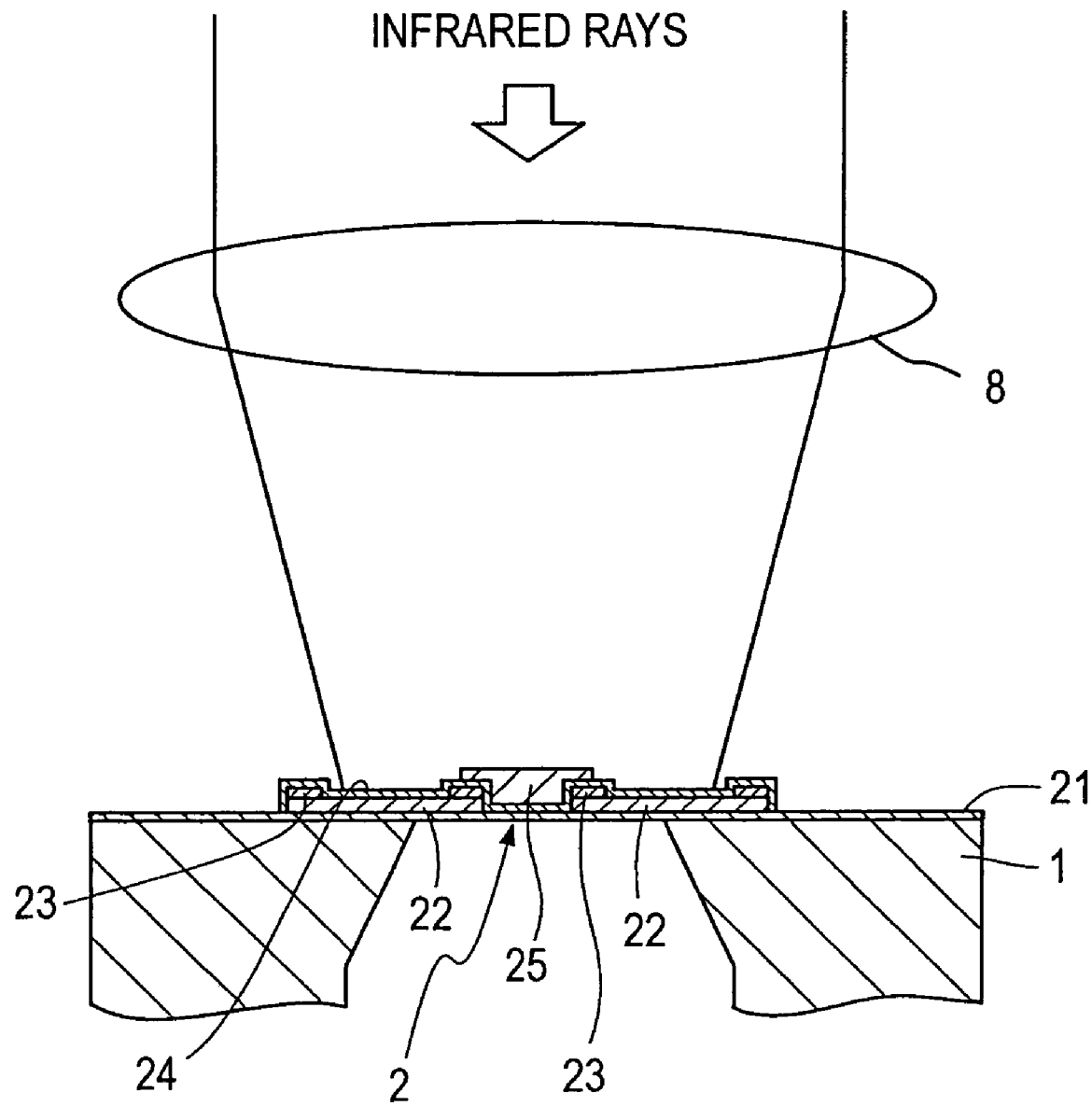
FIG. 13 is a sectional view similar to FIG. 2 showing one example of the general optical sensor.

FIG. 13 is an outlined sectional view showing one example of the general infrared sensor without use of any three-dimensional photonic crystal lens. In the infrared sensor of this comparison example 1, a manufacturing process of a thermopile type infrared detection element 2 is the same as that in the first embodiment, and in FIG. 13, elements and portions corresponding to those in FIGS. 1 and 2 will be denoted by the same reference numerals or characters attached thereto and explained briefly.

As a substrate 1, a silicon (Si) substrate having a generally square shape in plan was prepared, the substrate 1 having an insulation layer 21 formed over the entire surface thereof. A thermopile type infrared detection element or device 2 was formed on the surface of the insulation layer 21 of the substrate 1. This thermopile type infrared detection element 2 comprises: the insulation layer 21 having a generally square shape in plan; strip-like thermoelectric material layers 22 that consist of n-type semiconductors and p-type semiconductors constituting four thermocouples formed on the surface of the insulation layer 21; and electrode patterns 23 formed on the surface of the insulation layer 21 at the peripheral portion and the central portion thereof, each electrode pattern having a generally square shape, in order to electrically connect the four thermocouples in series with one another.

Then, a passivation layer 24 was formed on an area having a generally square shape in plan in which the thermoelectric material layers 22 and the electrode patterns 23 are included by sputtering so that the surfaces of the thermoelectric material layers 22 and the electrode patterns 23 were covered by the passivation layer 24. The principal purpose of the passivation layer 24 resides in electric insulation. Next, a blackened gold was deposited by evaporation on a central region having a generally square shape in which the eight hot junctions of the thermopile type infrared detection element 2 are included thereby to form an infrared absorption layer 25 for absorbing infrared rays.

The comparison example 1 used a convex lens 8 instead of a three-dimensional photonic crystal lens 90 and was arranged such that it collects incident infrared rays through the convex lens 8 and conduct them to the photosensitive surface of the thermopile type infrared detection element 2. For that reason, a distance from the top surface of the infrared absorption layer 25 to the top surface of the convex lens 8 becomes long, and it was required to align the convex lens 8 with the thermopile type infrared detection element 2 with high precision.

A comparison between the comparison example 1 constructed as discussed above and the examples 1 to 5 was made with regard to efficiency, sensitivity, and external shape and size of the sensors.

As to the rate of collecting light incident on the lens and conducting it to the infrared absorption layer 25, the sensor of the example 1 could conduct incident infrared rays to the infrared absorption layer 25 at very high rate of about 100%, whereas the sensor of the comparison example 1 could conduct incident infrared rays to the infrared absorption layer 25 merely at the rate of about 30%. Since the sensors of the examples 2 to 5 could conduct incident infrared rays to the infrared absorption layer 25 at high rate of 90% or more, the sensors of the above-stated embodiments were very high in light collection and conduction efficiency as well as had high sensitivity.

As to the thickness of the sensors, in the sensor of the example 1, the photonic crystal lens was about 100 μm thick, whereas in the sensor of the comparison example 1, it was necessary that the distance from the infrared absorption layer to the top surface of the convex lens 8 is equal to or longer than 1 mm. Even in case of the composite sensor of the example 5, the photonic crystal filter 7 was about 160 μm thick, and in case of other photonic crystal filter, photonic crystal element or device, its thickness is about 200 μm at the most. Thus, the sensors of the examples 1 to 5 could be greatly reduced in thickness as compared with the sensor of the comparison example 1.

As to the temperature detection speed and the accuracy of the sensors, the sensors of the examples 3 and 4 were compared with the sensor of the comparison example 1. It is no difference between them that the upper side on the portions of the infrared absorption layer 25 corresponding to the hot junctions is an air layer, but in the examples 3 and 4, the cold junctions are in contact with the photonic crystal lens 90 through the buffer layer 6 having high thermal conductivity so that the substrate 1 as well as the buffer layer 6 and the photonic crystal lens 90 function as heat sinks. As a result, the cold junctions are quickly cooled down to and maintained at a temperature that is the same as the ambient temperature. On the contrary, in the comparison example 1, an air layer exists on the upper side of the cold junctions. Since the thermal conduction occurs through only the substrate 1, the cooling efficiency is low. Consequently, the sensors of the examples 3 and 4 were rapid in detection speed and could detect a temperature with high accuracy. It is needless to say that the sensors of the examples 1, 2 and 5 were also rapid in detection speed and could detect a temperature with high accuracy as compared with the sensor of the comparison example 1.

In addition, as to the positional error of collected light through the lens, in the sensor of the comparison example 1, since the distance from the lens to the infrared detection element is long, it was strongly subject to the influence of the accuracy of assembling, whereas in the sensors of the examples 1 to 5, the lens was formed directly on and integrally with the infrared detection element in any one of them, and hence there did not occur a trouble that optical axes of the lens and the infrared detection element were not aligned with each other.

As stated above, the infrared sensors of the examples 1 to 5 are high in light collection and conduction efficiency, have high sensitivity, and are small in the external shape and size. Moreover, the sensors of these examples are essentially fabricated with high accuracy, and hence productivity thereof are high.

The infrared sensor of the example 5 in which a photonic crystal filter was formed compositely on a photonic crystal lens, has a very simple structure and can be fabricated by very easy manufacturing process as compared with a prior art composite infrared sensor. This fact shows that an element or device realizable by a photonic crystal, for example, such as a switch, shutter, tunable filter, attenuator, waveguide or the like can be compositely (integrally) formed on a photonic crystal lens by use of very easy manufacturing process.

Further, it goes without saying that materials or substances, shapes, and manufacturing process of the infrared detection element, the substrate, the passivation layer, the infrared absorption layer, the photonic crystal, the buffer layer and the like, or constitution, construction, composition and the like of the infrared detection element, the photonic crystal, etc. are not limited to those shown and described in the embodiments, and may be changed variously when necessary. Alternatively, there may be used a material or substance, shape, manufacturing process, constitution, construction, composition or the like already publicly known that is not used in the embodiments. Further, since the embodiments show only cases that the present invention was applied to infrared sensors, it is needless to say that the present invention is also applied to optical sensors other than infrared sensors and the same function and effects can be obtained.

As is clear from the foregoing description, in the present invention, since a photonic crystal lens was used as a light condensation or collection element, the light condensation or collection element can be integrated with a photo-detection element or device. Accordingly, the light condensation element and the photo-detection element are maintained in the state that they are in contact with each other or substantially in contact with each other, and so it is possible to collect light within a specified wavelength range into a photosensitive or light receiving portion with low loss as well as to collect incident light into a small spot. Moreover, occurrence of light that goes to a noise can be suppressed. As a result, even in case that an optical axis is not aligned with a photosensitive surface, it is possible to efficiently collect light, which results in that the sensitivity and the accuracy of the optical sensor can be made higher and that the optical sensor can be miniaturized. In addition, it is possible that a light collection function as well as a wavelength selection function, an incident angle control function, a shutter function, and the like can be integrated as one photonic crystal, and hence a photonic crystal having these functions can be manufactured by a small number of manufacturing processes. Accordingly, a miniaturized optical sensor can be provided at low manufacturing cost.

While the present invention has been described with regard to the preferred embodiments shown by way of example, it will be apparent to those skilled in the art that various modifications, alterations, changes, and/or minor improvements of the embodiments described above can be made without departing from the spirit and the scope of the present invention. Accordingly, it should be understood that the present invention is not limited to the illustrated embodiments, and is intended to encompass all such modifications, alterations, changes, and/or minor improvements falling within the scope of the invention defined by the appended claims.

What is claimed is:

1. An optical sensor comprising:
   a photo-detection element with a light absorption layer formed in a surface of said element; and
   a photonic crystal lens formed on the surface of said photo-detection element; wherein said photonic crystal lens comprises:
      a plurality of layers of a first photonic crystal made of a first glass and having a periodically arranged glass pattern; and
      a plurality of layers of a second photonic crystal made of a second glass, having a periodically arranged glass pattern and arranged alternating with the layers of the first photonic crystal in a stack of layers;
   wherein:
      a layer of the first photonic crystal has a first portion with a refractive index and a second portion with a refractive index that is greater than the refractive index of the first portion,
      the second portion of the layers of the first photonic crystal are disposed opposite to the light absorption layer, and
      a layer of the second photonic crystal has a refractive index that is less than the refractive index of the first portion.

2. The optical sensor as set forth in claim 1, wherein
   the first glass contains a material capable of being precipitated by heat or photochemical reaction, the first portion containing the material in an un-precipitated state and the second portion containing the material in a precipitated state; and
   the second glass does not contain the material.

3. An optical sensor comprising:
   a photo-detection element with a light absorption layer formed in a surface of said element; and
   a photonic crystal lens formed on the surface of said photo-detection element; wherein said photonic crystal lens comprises a block of globular particles of glass containing a material capable of being precipitated by heat or photochemical reaction, wherein the block comprises:
      a first portion of globular particles of glass containing the material in an un-precipitated state and having a refractive index; and
      a second portion of globular particles of glass containing the material in a precipitated state and having a refractive index that is greater than the refractive index of the first portion;
   wherein:
      the second portion of the block is disposed opposite to the light absorption layer, and
      the degree of precipitation of the material in the second portion varies such that the refractive index of the second portion varies from a side of the block disposed closest to the light absorption layer to a side of the block disposed farthest from the light absorption layer.

4. The optical sensor as set forth in claim 3, further comprising a buffer layer made of a material having a thermal conductivity that is higher than that of the block, wherein
the buffer layer is disposed on the surface of the photo-detection element;
the photonic crystal lens is on the buffer layer; and
said buffer layer has a hollow portion corresponding to a photo-detection part of the photo-detection element.

5. The optical sensor as set forth in claim 1, further comprising a photonic crystal filter on the photonic crystal lens, wherein the photonic crystal filter comprises:
a plurality of layers of a first filter glass having a refractive index; and
a plurality of layers of a second filter glass having a refractive index that is less than the refractive index of the layers of the first filter glass and arranged with they layers of the first filter glass in a stack of layers.

6. The optical sensor as set forth in claim 2, further comprising a photonic crystal filter on the photonic crystal lens, wherein the photonic crystal filter comprises:
a plurality of layers of a first filter glass having a refractive index; and
a plurality of layers of a second filter glass having a refractive index that is less than the refractive index of the layers of the first filter glass and arranged with they layers of the first filter glass in a stack of layers.

7. The optical sensor as set forth in claim 3, further comprising a photonic crystal filter on the photonic crystal lens, wherein the photonic crystal filter comprises:
a plurality of layers of a first filter glass having a refractive index; and
a plurality of layers of a second filter glass having a refractive index that is less than the refractive index of the layers of the first filter glass and arranged with they layers of the first filter glass in a stack of layers.

8. The optical sensor as set forth in claim 4, further comprising a photonic crystal filter on the photonic crystal lens, wherein the photonic crystal filter comprises:
a plurality of layers of a first filter glass having a refractive index; and
a plurality of layers of a second filter glass having a refractive index that is less than the refractive index of the layers of the first filter glass and arranged with they layers of the first filter glass in a stack of layers.

9. The optical sensor as set forth in claim 1, wherein
the periodically arranged glass patterns of the layers of first photonic crystal and the layers of the second photonic crystal are formed by through holes in the form of a matrix.

10. The optical sensor as set forth in claim 9, further comprising a photonic crystal filter on the photonic crystal lens, wherein the photonic crystal filter comprises:
a plurality of layers of a first filter glass having a refractive index; and
a plurality of layers of a second filter glass having a refractive index that is less than the refractive index of the layers of the first filter glass and arranged with they layers of the first filter glass in a stack of layers.

* * * * *